United States Patent [19]
Caillat

[11] Patent Number: 5,853,603
[45] Date of Patent: Dec. 29, 1998

[54] MANUFACTURING PROCESS OF A MICROELECTRONIC DEVICE CONTAINING, ON A SUBSTRATE, A PLURALITY OF INTERCONNECTED ELEMENTS

[75] Inventor: Patrice Caillat, Echirolles, France

[73] Assignee: Commissariat a l'Energie Atomique, Paris, France

[21] Appl. No.: 747,929

[22] Filed: Nov. 12, 1996

[30] Foreign Application Priority Data

Nov. 17, 1995 [FR] France .................................. 95 13658

[51] Int. Cl.⁶ .............................. H01L 21/00; B44C 1/22
[52] U.S. Cl. ................................ 216/84; 216/13; 216/41; 438/14; 438/129
[58] Field of Search .................................. 216/13, 18, 40, 216/41, 59, 61, 84, 86; 438/14, 129

[56] References Cited

U.S. PATENT DOCUMENTS

| | | |
|---|---|---|
| 3,585,712 | 6/1971 | Boncuk . |
| 4,753,901 | 6/1988 | Ellsworth et al. ................... 438/129 X |
| 4,786,613 | 11/1988 | Gould et al. ............................ 438/129 |
| 4,969,029 | 11/1990 | Ando et al. .............................. 438/129 |

FOREIGN PATENT DOCUMENTS

| | | |
|---|---|---|
| 0 481 703 | 4/1992 | European Pat. Off. . |
| 2 558 989 | 8/1985 | France . |
| 14 39 648 | 3/1969 | Germany . |
| WO 82/02603 | 8/1982 | WIPO . |

OTHER PUBLICATIONS

IEEE Journal of Solid–State Circuits, vol. SC–16, No. 5, pp. 506–514, Oct., 1981 Robert T. Smith, et al., "Laser Programmable Redundancy and Yield Improvement in a 64K DRAM".

International Conference on Wafer Scale Integration, p. 193–201, 1989, Dr. Jacques Trilhe "A 4 MBIT Static RAM".

*Primary Examiner*—William Powell
*Attorney, Agent, or Firm*—Oblon, Spivak, McClelland, Maier & Neustadt, P.C.

[57] ABSTRACT

A method of manufacturing a microelectric device containing, on a substrate, a plurality of interconnected elements, comprising the steps of manufacturing on a substrate cells of elements, testing of the cells in order to distinguish the valid cells, formation of junction bands in an electrical conductive material connecting at least one valid cell, the junction bands being formed in fields, each field comprising an overlapping area with at least one neighboring field.

10 Claims, 2 Drawing Sheets

MANUFACTURING PROCESS OF A MICROELECTRONIC DEVICE CONTAINING, ON A SUBSTRATE, A PLURALITY OF INTERCONNECTED ELEMENTS

BACKGROUND OF THE INVENTION

1. Field of the Invention

This invention concerns a process for manufacturing a microelectronic device containing, on a substrate, a plurality of interconnected elements.

In general, the invention may be applied in the field of microelectronics, for example in the manufacturing of integrated circuits whose final function is the sum of the functions of individual elements or integrated circuits whose elements are interconnected during the manufacturing process in order to obtain a collective electroplated coating.

The invention thus applies, for example, to the manufacturing of devices fitted with a plurality of electrodes and acting as support in carrying out collective electrochemical reactions.

The invention also applies to the manufacturing of "intelligent" detectors integrating on a same substrate sensitive sensors and control circuits associated to these sensors.

The invention also applies to the manufacturing of electronic memories.

2. Discussion of the Background

In the field of microelectronics and particularly in the manufacturing of highly complex integrated circuits featuring a large number of elements, these integrated circuits are subdivided into cells respectively grouping a certain number of elements. This type of structure increases manufacturing output by introducing a redundancy of cells for at least part of the integrated circuit's function.

When its manufacturing is complete, such an integrated circuit is said to be "reconfigured". This operation consists of interconnecting the valid cells and isolating cells with defects.

In this connection, "A 4 Mbit Static RAM" by J. Trilhe, International Conference of Wafer Scale Integration, 1989, pp. 193–200, may be consulted.

In order to reconfigure a circuit, conductive tracks linking cells whose validity has been checked may be added, or conductive tracks linking valid cells to invalid cells may be destroyed.

The junction of the valid cells and the isolation of the invalid cells may in particular be carried out by tools operating with a programmable laser source. With these tools it is possible either to obtain a localized deposition of a conductive material in order to form a junction track or to destroy locally a conductive track in order to interrupt it. In this connection, "Laser Programmable Redundancy and Yield Improvement in a 64K DRAM" by R. T. Smith et al., IEEE Journal of Solid-State Circuits Vol. SC-16, No. 5, October 1981, pp. 506 to 514, may be consulted.

The circuits may also be reconfigured by mechanical sawing of the electric connection lines which are to be eliminated.

However, mechanical cutting materials and laser equipment are costly and are financially viable only in the case of mass production of integrated circuits.

Moreover, the reconfiguration techniques known in the prior art call for a supplementary stage in the manufacturing process of integrated circuits.

SUMMARY OF THE INVENTION

The purpose of this invention is therefore to propose a process for manufacturing a microelectronic device incorporating the reconfiguration stage and does not require specifically designed material.

The invention also aims to provide a simple and inexpensive process for manufacturing and reconfiguring an integrated circuit.

It also aims to provide a process adapted to the manufacturing of specific microelectronic devices.

Another objective of the invention is to propose a reconfiguration process which does not necessitate a supplementary stage in the lithographic processes of depositions and etching used in the manufacturing of microelectronic devices.

With a view notably to attaining the objectives listed above, the invention more specifically concerns a manufacturing process of a microelectronic device comprising, on a substrate, a plurality of interconnected active elements. According to the invention the process includes the following successive operations:

a) manufacturing of element cells on a substrate, each cell containing at least one element, the element cells being electrically insulated from each other and at least one element of each cell presenting at least one connection terminal for connecting the element cells according to a given connection plan, b) test of the cells in order to distinguish valid cells whose elements are valid from cells containing at least one invalid element, c) formation of junction bands in an electrical conductive material connecting at least one connection terminal of at least one element of a valid cell with at least one element of another valid cell, the junction bands being formed in valid, substantially identical fields, each valid field covering respectively a valid cell and comprising at least one marginal overlapping zone with at least one neighboring valid field, the overlapping zone comprising at least one portion of junction band.

In the context of this invention, element is understood to mean both an active element (for example a transistor, a microprocessor, a memory cell, etc.) and a passive element such as an electrode, a micromachined structure, etc. The notion of element also applies both to an individual element and a series of active and/or passive elements.

Moreover, the term "valid element" is taken to mean an element which does not present a redhibitory defect in relation to a subsequent collective treatment of the elements of the device.

Such a redhibitory defect may, for example, be a short-circuit in the element which connects its power supply to its ground and which renders the elements linked to it defective.

Each cell manufactured on the substrate may comprise one or more elements.

In the manufacturing of large microelectronic devices, during the photolithographic stages for the manufacturing of components, the substrate wafer is not usually insolated simultaneously. Portions of the substrate are successively insolated through masks containing patterns corresponding to the components or parts of the component to be manufactured. Identical portions of the substrate are successively insolated by carrying out a relative movement of the substrate in relation to the mask(s) and to the optical insolation system. Thus, in the ensuing text the term "field" will be understood to mean such a portion of the substrate corresponding to an insolation region through a lithographic mask.

The cell test may be carried out by applying or measuring the control voltage on the specially provided test contacts.

The cell test may preferentially consist of the individual test of each element, particularly when the cells comprise several elements. A cell is considered valid when all its elements are valid.

In the course of stage a) the elements corresponding to each cell are manufactured. However, as these cells are juxtaposed there is no electrical contact between the elements of the different cells, and, in particular, there is no electrical contact between the connection terminals of the elements of the different cells.

The valid fields of operation c) which are substantially superimposed with the cells are slightly larger than said cells, thus creating an overlap between neighboring fields.

In the overlapping part, located in a marginal, i.e. peripheral zone of the valid fields, one or more portions of junction bands are manufactured in order to interconnect certain elements of the cells corresponding to the neighboring valid fields.

In particular, the junction band portions may link the connection terminals of the corresponding elements.

According to a special implementation the manufacturing of the junction bands may comprise:

- the deposition on the entire substrate of a layer of electrical conductive material covering the elements,
- the deposition of a layer of photosensitive resin on the layer of electrical conductive material,
- the insolation of the resin in said valid fields, through a mask, creating, by overlapping of the valid fields, patterns corresponding to the junction bands,
- the processing of the resin, in order to eliminate its presence outside regions corresponding to the junction bands,
- the etching of the layer of conductive material by leaving the junction bands intact.

The junction bands may also be defined by "lift off".

In this case their manufacturing consists of:

- the deposition on the entire substrate of a layer of photosensitive resin,
- the insolation of the resin in said valid fields, through a mask, creating, by overlapping of the valid fields, patterns corresponding to the junction bands,
- the processing of the resin, in order to eliminate its presence outside regions corresponding to the junction bands,
- the deposition on the entire substrate of a layer of electrical conductive material, and
- the etching of the resin and the elimination by lift off of the electrical conductive material outside the regions corresponding to the junction bands.

Advantageously thanks to the invention, the resin may be insolated in the fields field by field with a single predetermined mask. The choice of whether or not to interconnect a cell does not necessitate any modification of the mask, but is carried out simply by insolating, or not insolating, the corresponding fields. In particular, only the valid fields corresponding to the valid cells are insolated.

In a special embodiment of the cells, each cell may include electrodes and, if required, an electrode multiplexing circuit.

In the event that the elements contain a plurality of conductive levels these said levels are generally formed during several photolithographic stages of deposition and etching.

However, according to an advantageous aspect of the invention, one of the levels of conductive material may be manufactured simultaneously with the junction bands in said fields.

As a result of this characteristic, the "reconfiguration" process of the invention, unlike a standard manufacturing of elements, does not involve a supplementary stage of lithographic deposition and etching.

In cases when the microelectronic device to be manufactured includes a plurality of cells with identical elements, the elements of these cells, or the cells, may advantageously be manufactured by field photorepetition containing lithographic patterns. In cases when the cells (whether identical or different) are not manufactured by photorepetition, they are formed by using lithographic stages insolating all the cells through a mask.

Field photorepetition of fields on a substrate consists in the successive insolation of the different fields through a same mask. For this purpose, the mask and an optical projection device are moved above the substrate plate in a device usually referred to as a "stepper".

Other characteristics and advantages of this invention will emerge from the following description, provided for purely illustrative and non-limitative purposes, in which reference is made to the figures of the accompanying drawings.

BRIEF DESCRIPTION OF THE DRAWINGS

A more complete appreciation of the invention and many of the attendant advantages thereof will be readily obtained as the same becomes better understood by reference to the following detailed descriptions when considered in connection with the accompanying drawings, wherein.

DESCRIPTION OF THE PREFERRED EMBODIMENTS

Figure 1:
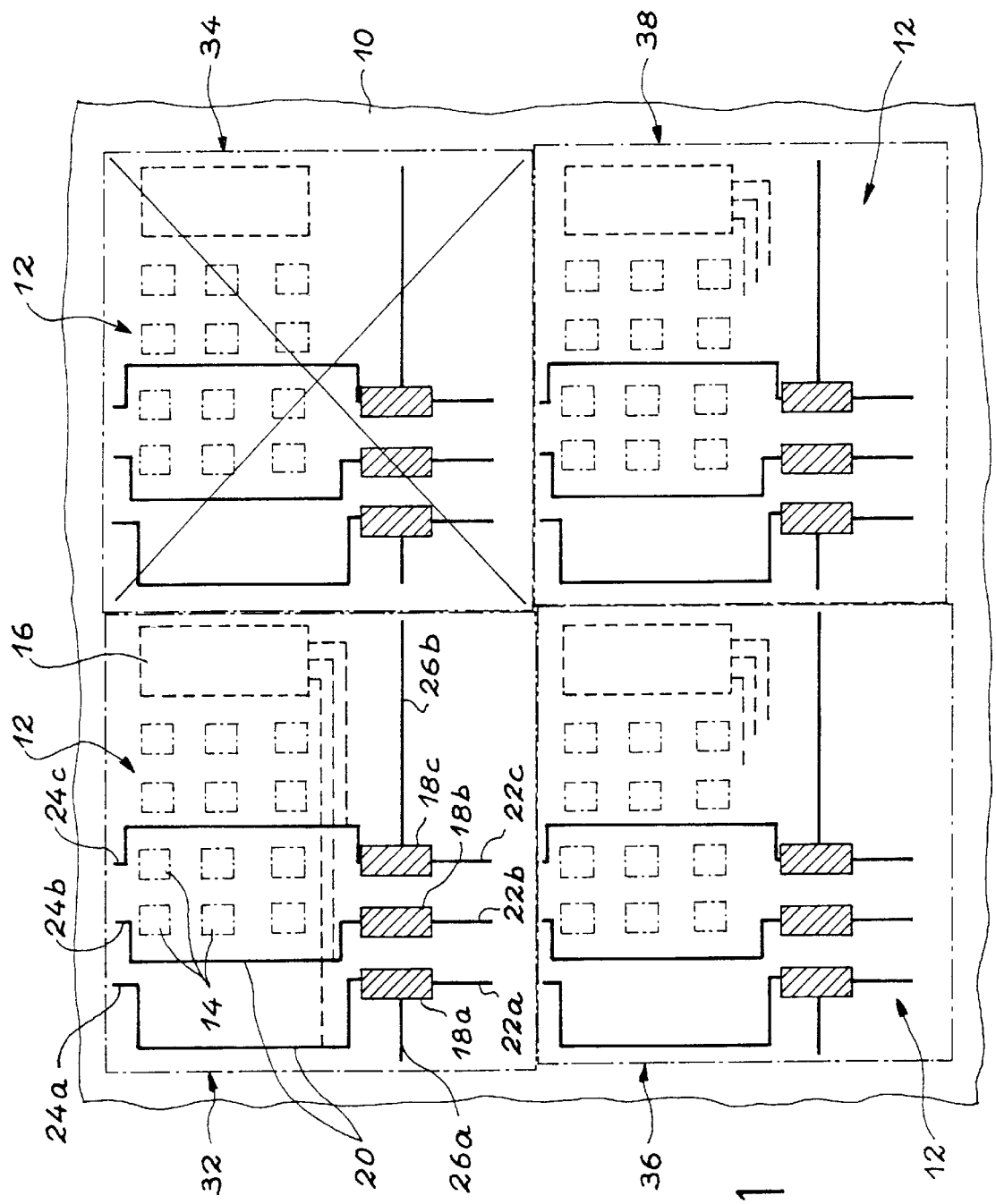
FIG. 1 shows first photolithographic fields on a substrate for the manufacturing of cells of a microelectronic device, according to the invention.

Referring now to the drawings, wherein the like reference numerals designate identical or corresponding parts throughout the several views, and more particularly to FIG. 1 thereof, there is illustrated an example of a microelectronic device to be treated according to the invention.

The device comprises on a substrate 10 a plurality of cells 12 which are identical to each other and which, in this example, are manufactured by photorepetition. Each cell may consist of one or more elements.

In the example given in FIG. 1, each cell 12 includes a set of electrodes 14 (not yet manufactured) and an addressing (or multiplexing) circuit 16 of the electrodes.

Each cell also contains test contacts 18 and conductive tracks 20 whose extremities form connection terminals of the elements and in particular of the circuit 16.

The different active or passive elements of each cell are manufactured on different conductive levels in the course of different lithographic stages of deposition and etching.

Thus, FIG. 1 corresponds to the stage of manufacturing conductive tracks and test contacts.

The position of the electrodes 14 and of the circuit 16 is represented by a discontinuous line indicating that these elements are manufactured respectively during a subsequent stage and during previous stages.

As the electrodes and the addressing circuits 16 are not manufactured simultaneously with the test contacts and are therefore not located on a same conductive element, electrical links between these elements do not appear in detail in the figure.

As illustrated in FIG. 1, each cell 12 corresponds to a first field 32, 34, 36, 38 of the substrate.

Each field corresponds to an insolation surface of the substrate through a mask presenting patterns corresponding to the elements to be manufactured on a given conductive level during a photolithographic stage.

During the manufacturing of a same lithographic level, the whole of the plate is, for example, covered by a layer of forming material and by a layer of photosensitive resin.

The photosensitive resin is then successively insolated in each field through a same mask in order to repeat, in each field, identical insolation patterns. The resin is processed and the forming material eliminated in the areas not protected by the resin, leaving the elements according to the patterns of the mask. For example, in FIG. 1 this concerns the contacts 18a, 18b, 18c and the conductive tracks 20, which are manufactured in a penultimate photolithographic stage of the process. The resin is then eliminated.

As may be seen in FIG. 1, the elements of the cell such as the addressing circuit 16, the electrodes 14 and the test contacts 18a, 18b, 18c and the conductive tracks 20 are manufactured in substantially juxtaposed fields 32, 34, 36, 38. Thus, the elements of each cell are electrically isolated from the elements of the neighboring cells.

It may be noted that the connection terminals of the conductive tracks extend into a peripheral region of the first fields without, however, attaining the edges of these fields.

After manufacturing of the elements and in particular the test contacts, each element, that is to say each circuit 16, is tested by applying or by measuring an appropriate set of test voltages on the test contacts of each cell.

The test of the cell elements is made easier because these cells are electrically isolated from each other.

In the rest of the description the cell elements corresponding to the fields 32, 36 and 38 are considered to have been shown valid during the test and at least one of the cell elements corresponding to the field 34 is considered to present a ground/power supply short-circuit making the whole of the cell non valid.

The elements of the cell corresponding to the field 34 are thus considered to be invalid.

Figure 2:
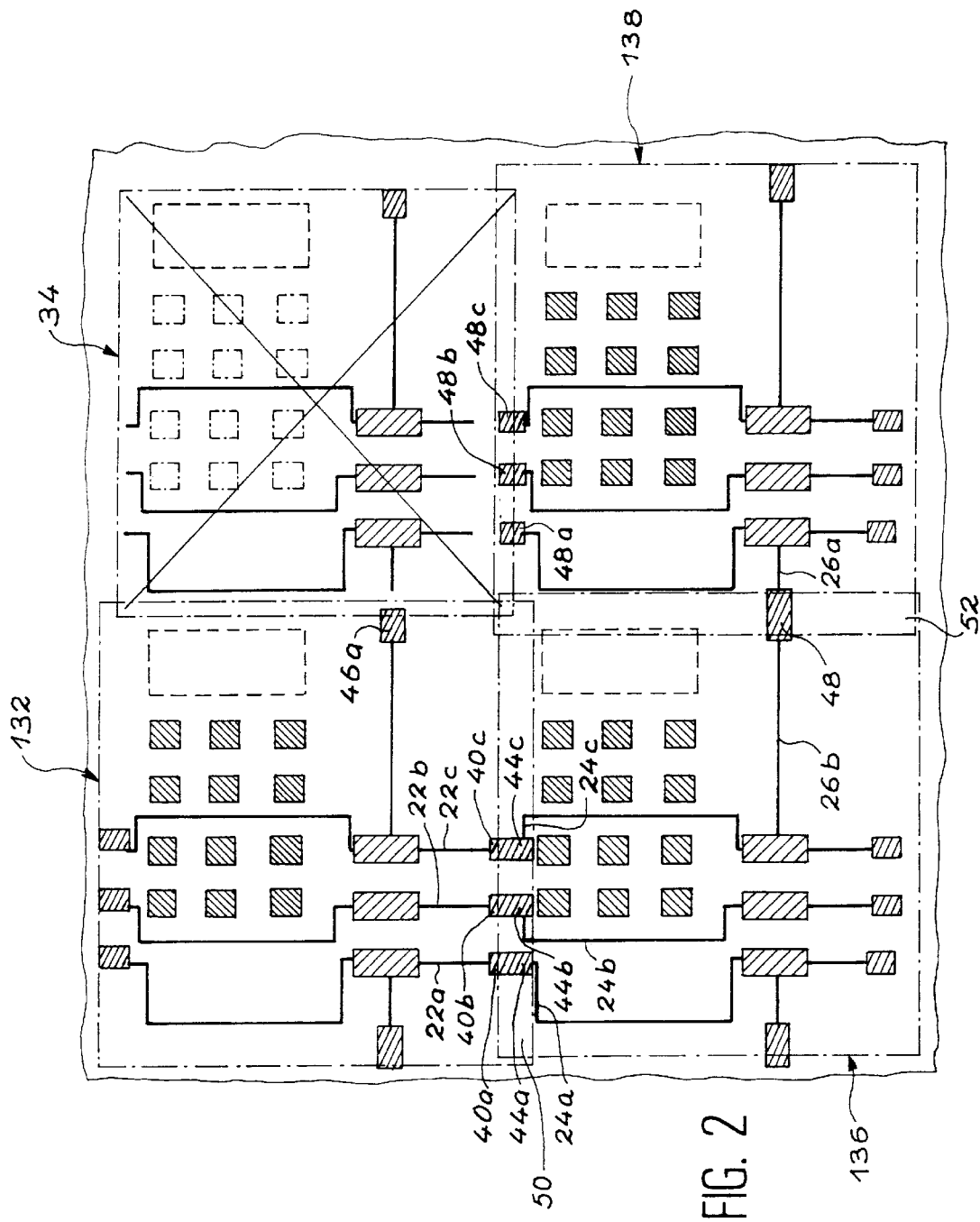
FIG. 2 shows second photolithographic fields on the substrate for the manufacturing of junction bands between the cell elements of the device, according to the invention.

FIG. 2 corresponds to the interconnection of the cells (reconfiguration) of the device. This consists in interconnecting certain valid elements corresponding to valid cells according to a pre-determined connection plan.

For example, the connection plan includes the paralleling of input and output terminals corresponding respectively to each valid active element.

In this example, the reconfiguration takes place during a final photolithographic stage of a final conductive level.

This phase makes it possible to form, in the final level, connection bands marked 40a, 40b, 40c, 44a, 44b, 44c.

The final lithographic stage is carried out in the second fields 132, 136 and 138 which substantially cover the fields 32, 36 and 38.

The fields 132, 136 and 138 also include an overlapping zone with the neighboring fields. Thus the fields 132 and 136 have in common an overlapping zone 50 and the fields 136 and 138 have a common overlapping zone 52.

The photolithographic mask corresponding to the final stage includes for each connection terminal a pattern corresponding to a portion of a junction band designed to be connect the connection terminal to a terminal of a neighboring cell according to a connection plan.

At least one part of each pattern extends into the marginal zone of the second fields, this marginal zone corresponding to the overlapping zone with a neighboring field. In this way, the part of the pattern covers a corresponding part of a pattern of a portion of junction band of a second neighboring field.

Thus, when two second neighboring fields presenting an overlapping zone are successively insolated through a mask with patterns corresponding to the junction bands, in the course of the final photolithographic stage, one or more junction bands linking the connection terminals are formed. Each connection band is manufactured according to a pattern corresponding to the juxtaposition and the partial overlapping of the patterns corresponding to the portions of the band on the neighboring fields.

For example, bands 40a, 44a; 40b, 44b and 40c, 44c connect respectively the terminals 22a, 22b, 22c of the field 132 to the terminals 24a, 24b, 24c of the field 136, and a band 48 links the terminals 26b and 26a of the fields 136 and 138.

Each connection band includes two portions of band corresponding to patterns of two neighboring fields presenting an overlap.

The terminals 22a and 24a of the fields 132 and 138 are, for example, linked by a junction band including two portions 40a and 44a formed respectively by photolithographic patterns of the two fields 132 and 138 which overlap at least partially in the zone 50.

The part of the substrate corresponding to the first field 34 is ignored during the final lithographic stage. It is not insolated and all the conductive material is eliminated. Consequently no conductive element is formed. It may be observed in FIG. 2 that portions of connection bands 48a, 48b, 48c and 46a are formed respectively at the periphery of the second fields 138 and 132 but, since there is no corresponding portion of connection band in the field 34, no electrical link is established between the elements of the cells corresponding to the fields 34 and to the fields 132 and 138. Thus the cell corresponding to the field 34 remains electrically insulated.

This formation stage of the final conductive level may be carried out as previously described, that is to say by deposition of a layer of conductive material such as aluminum and of a photosensitive resin. The final conductive level is formed by the insolation of the resin according to the patterns corresponding to the connection bands, by the processing of the resin and by the etching of the non-protected conductive material. It may be noted that the insolation is advantageously performed field after field using photorepetition equipment of a known type.

The pattern of the elements of the final conductive level may also be defined by lift off of the conductor.

In this case, the conductor is placed on a layer of resin formed according to a plan which complements the pattern of the junction bands to be manufactured.

The parts of the layer of the conductor corresponding to said complementary pattern are then eliminated by lift off by etching the subjacent resin.

As may be seen in FIG. 2, the forming phase of the final layer of conductor for the formation of the junction bands may advantageously be used to manufacture the electrodes 14 in the valid fields 132, 136, 138.

Thus, the "reconfiguration" stage of the device merges with the manufacturing stage of the final conductive level of the constituent elements of the device.

FIG. 2 illustrates a particular application of the invention for manufacturing a device containing a plurality of chips serving as support for electrochemical reactions.

When an addressing signal including an electrode address is sent simultaneously to all the valid addressing circuits of all the valid cells of the device, the electrode of each cell corresponding to the electrode address may be brought to a potential capable of triggering an electrochemical reaction.

The possibility of triggering selectively a chemical reaction may be used to advantage in forming selectively electrochemical depositions on the electrodes.

In another sphere, the process of the invention may be used to advantage in interconnecting the valid memory cells of an electronic memory device. Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A method of manufacturing and reconfiguration of a microelectronic device containing, on a substrate, a plurality of interconnected elements, comprising the steps of:

(a) manufacturing cells on a substrate, each of the cells having at least one element, each of the cells being electrically isolated from each other, and at least one element of each of the cells having at least one connection terminal for interconnecting the cells according to a given connection plan;

(b) testing the cells in order to distinguish cells having valid elements from cells containing at least one invalid element; and (c) forming junction bands in an electrical conductive material connecting at least one connection terminal of at least one element of a valid cell with at least one element of another valid cell, the junction bands being formed in valid, substantially identical fields, each valid field covering respectively a valid cell and comprising at least one marginal overlapping zone with at least one neighboring valid field, the overlapping zone comprising at least one portion of a junction band.

2. The method according to claim 1, wherein the step of testing the cells comprises the step of testing each element of the cells.

3. The method according to claim 1, wherein the step of forming junction bands comprises the steps of:

depositing on the substrate a layer of electrical conductive material covering the elements of the cells;

depositing a layer of photosensitive resin on the layer of electrical conductive material;

insolating the resin in the valid fields, through a mask, and creating, by overlapping of the valid fields, patterns corresponding to the junction bands;

processing the resin, to eliminate the resin outside regions corresponding to the junction bands; and etching exposed portions of the layer of conductive material, leaving the junction bands intact.

4. The method according to claim 3, wherein the step of insolating the resin comprises the step of insolating the resin, valid field by valid field, with photorepetition equipment.

5. The method according to claim 1, wherein the step of forming junction bands comprises the steps of:

depositing on the substrate a layer of photosensitive resin;

insolating the resin in the valid fields;

creating, through a mask overlapping the valid fields, patterns corresponding to the junction bands;

processing the resin, to eliminate the resin outside regions corresponding to the junction bands;

depositing on the substrate a layer of electrical conductive material; and etching the resin and eliminating the electrical conductive material outside the regions corresponding to the junction bands by lift-off.

6. The method according to claim 5, wherein the step of insolating the resin comprises the step of insolating the resin, valid field by valid field, with photorepetition equipment.

7. The method according to claim 1, wherein the step of manufacturing cells comprises the step of manufacturing the elements of the cells in a plurality of levels of conductive material; and wherein the step of forming the junction bands comprises the step of forming the junction bands in one level of the plurality of levels of conductive material.

8. The method according to claim 1, wherein the microelectronic device includes identical cells, and the method comprises the step of manufacturing the identical cells by photorepetition of lithographic patterns.

9. The method according to claim 6, wherein the step of manufacturing cells comprises the step of manufacturing cells, each of the cells having electrodes.

10. The method according to claim 9, wherein the step of manufacturing cells comprises the step of manufacturing cells, each of the cells having a multiplexing circuit of the electrodes.

* * * * *